(12) United States Patent
Siahaan et al.

(10) Patent No.: US 10,377,000 B2
(45) Date of Patent: Aug. 13, 2019

(54) HEAT DISSIPATION CASE AND METHODS FOR NAVIGATING HEAT FROM AN ELECTRONIC DEVICE

(71) Applicant: Apple Inc., Cupertino, CA (US)

(72) Inventors: Edward L. Siahaan, San Francisco, CA (US); Siddhartha Hegde, San Jose, CA (US); Dhaval N. Shah, Fremont, CA (US)

(73) Assignee: Apple Inc., Cupertino, CA (US)

(*) Notice: Subject to any disclaimer, the term of this patent is extended or adjusted under 35 U.S.C. 154(b) by 324 days.

(21) Appl. No.: 14/836,894

(22) Filed: Aug. 26, 2015

(65) Prior Publication Data

US 2017/0064869 A1    Mar. 2, 2017

(51) Int. Cl.
| | |
|---|---|
| *F28F 7/00* | (2006.01) |
| *G06F 1/16* | (2006.01) |
| *H05K 5/00* | (2006.01) |
| *H05K 7/00* | (2006.01) |
| *B23P 15/26* | (2006.01) |
| *H04M 1/02* | (2006.01) |

(Continued)

(52) U.S. Cl.
CPC ............ *B23P 15/26* (2013.01); *G06F 1/1626* (2013.01); *G06F 1/203* (2013.01); *H04M 1/02* (2013.01); *G06F 1/206* (2013.01); *G06F 2200/1633* (2013.01); *H05K 7/20* (2013.01)

(58) Field of Classification Search
CPC .......... G06F 1/203; G06F 1/206; H04M 1/02; H05K 7/20; H01L 23/3733
USPC ...................... 361/379.52, 679.56; 165/80.2
See application file for complete search history.

(56) References Cited

U.S. PATENT DOCUMENTS

| | | | |
|---|---|---|---|
| 7,292,441 B2 | 11/2007 | Smalc et al. | |
| 7,609,512 B2 | 10/2009 | Richardson et al. | |

(Continued)

FOREIGN PATENT DOCUMENTS

| | | | |
|---|---|---|---|
| CN | 202261430 U | * | 5/2012 |
| CN | 104717328 A | * | 6/2015 |

(Continued)

OTHER PUBLICATIONS

Publication entitled "Polymers and plastics An introduction to their structures and properties".*

*Primary Examiner* — Paul Alvare
(74) *Attorney, Agent, or Firm* — Dickinson Wright RLLP

(57) ABSTRACT

An accessory device suitable for use with an electronic device is disclosed and may be designed to provide a protective cover and dissipate heat from the device. Regarding the latter, the accessory device may include a thermally conductive layer disposed in the accessory device. The thermally conductive layer may extend from a first end of the accessory device proximate to a heat-generating component in the electronic device, to a second end away from the heat-generating component. The thermally conductive layer is designed to navigate heat away from the heat-generating component to the second end where the heat escapes the accessory device. The second end may include one or more openings to facilitate heat transfer from the accessory device. In other embodiments, the accessory device includes a phase change material that absorbs heat and changes to a liquid, then passes the heat to another location in the accessory device.

19 Claims, 11 Drawing Sheets

(51) Int. Cl.
*G06F 1/20* (2006.01)
*H05K 7/20* (2006.01)

(56) References Cited

U.S. PATENT DOCUMENTS

| | | | |
|---|---|---|---|
| 8,205,744 B1 * | 6/2012 | Tashjian | A45C 3/001 |
| | | | 174/380 |
| 8,325,483 B2 | 12/2012 | Kondoh et al. | |
| 2008/0310108 A1 | 12/2008 | Eriksson et al. | |
| 2010/0321897 A1 * | 12/2010 | Hill | B29C 66/304 |
| | | | 361/720 |
| 2011/0242764 A1 * | 10/2011 | Hill | G06F 1/203 |
| | | | 361/705 |
| 2012/0048528 A1 * | 3/2012 | Bergin | H01L 23/3733 |
| | | | 165/185 |
| 2013/0233762 A1 * | 9/2013 | Balaji | B65D 25/00 |
| | | | 206/736 |
| 2014/0110083 A1 | 4/2014 | Cheng | |
| 2015/0029660 A1 | 1/2015 | Huang et al. | |
| 2015/0034291 A1 * | 2/2015 | Wong | G06F 1/20 |
| | | | 165/185 |
| 2015/0055300 A1 | 2/2015 | Hsieh et al. | |
| 2016/0295980 A1 * | 10/2016 | Wu | H04B 1/3888 |

FOREIGN PATENT DOCUMENTS

| | | | | |
|---|---|---|---|---|
| CN | 204578584 U | * | 8/2015 | ........... H04B 1/3888 |
| EP | 2806419 A1 | * | 11/2014 | ........... H04M 1/0249 |

* cited by examiner

HEAT DISSIPATION CASE AND METHODS FOR NAVIGATING HEAT FROM AN ELECTRONIC DEVICE

FIELD

The following relates to an accessory device for an electronic device. In particular, the following relates to an accessory device that, in addition to providing a protective cover for the electronic device, provides a heat removal system to draw heat from one or more heat-generating components in the electronic device.

BACKGROUND

Accessory devices are used to provide a protective cover for an electronic device. The accessory device generally covers the enclosure, or housing, and protects the electronic device in the event the electronic device is dropped. The thickness of an accessory device varies with the desired level of protection. For example, some accessory devices include a thickness of several millimeters and offer increased protection.

However, while the increased thickness may provide additional protection, it may also cause some drawbacks. For example, some electronic devices include a heat-generating component, such as an integrated circuit, offering high-performance capabilities. However, these heat-generating components also generate a relatively large amount of heat. The relative thickness of the accessory device may cause the heat to become trapped in the electronic device and/or the accessory device. In some cases, the heat causes the electronic device to limit, or throttle down, the heat-generating component to reduce its performance in order to reduce the heat, which may then reduce the overall performance of the electronic device. Alternatively, or in combination, the accessory device may retain the heat causing a hot spot in the accessory device. As a result, a user contacting the hot spot may burn the user.

SUMMARY

In one aspect, an accessory device suitable for use with an electronic device having a component is described. The accessory device may include a wall that receives the electronic device. The accessory device may further include a heat transfer mechanism disposed in the wall. The heat transfer mechanism may include a heat collector capable of receiving heat generated from the component. The heat transfer mechanism may further include a heat conduit thermally coupled with the heat collector. The heat conduit may provide a pre-defined heat path that limits a transfer of heat to a pre-defined portion of the wall.

In another aspect, a method for forming an accessory device having a shell configured to secure an electronic device and aid in navigating heat away from a heat-generating component in the electronic device is described. The method may include disposing a thermally conductive layer in the shell in a first location that corresponds to a location of the heat-generating component when the electronic device is secured by the shell. The method may further include extending the thermally conductive layer from the first location to a second location different from the first location. The thermally conductive layer may define a path along which heat flows from the first location to the second location. In some embodiments, the second location corresponds to an opening that extends through the shell to allow any of the heat at the opening to dissipate away from the shell.

In another aspect, an accessory device suitable for use with an electronic device having a heat-generating component is described. The accessory device may include a layer that includes an opening. The accessory device may further include a thermally conductive feature at least partially disposed in the opening. In some embodiments, in response to heat from the heat-generating component, the thermally conductive feature absorbs the heat from the electronic device by changing from a solid to a liquid.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
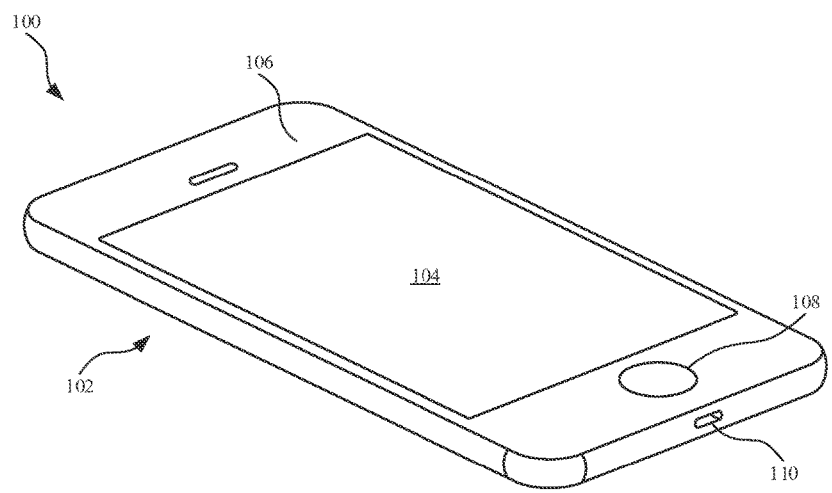
FIG. 1 illustrates an isometric view of an embodiment of an electronic device.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to an accessory device used not only to protect an electronic device disposed in the accessory device, but also draw heat from a heat source in the electronic device. Traditional accessory devices with a primary function of protecting the electronic device. However, the present disclosure describes various modifications to an accessory device such that the heat from the heat source in the electronic device may be navigated from the heat source and through the accessory device, and then may be removed from the accessory device by convective means.

The accessory device may include a plastic or polyamide shell formed from an injection molding process. A polymeric material such as silicone may surround an exterior region of the shell. Alternatively, the exterior region of the shell may include a thermally conductive elastomer designed to conduct heat. The thermally conductive material in the exterior region may be positioned in a location that is less likely to be contacted by a user. Either material coating may be formed by an over molding process to the shell. In addition, a heat conductive elastomer may cover an interior region of the shell, including the thermally conductive layer. Also, the shell may include a thermally conductive layer disposed or embedded in the shell. In this manner, the heat conductive elastomer in the interior region may transfer heat from the electronic device to the thermally conductive layer allowing the thermally conductive layer to navigate the heat away from the heat source, such as an integrated circuit, in the electronic device.

Further, in some embodiments, the accessory device includes an opening near the thermally conductive layer. The thermally conductive layer may navigate the heat away from a heat-generating component (in the electronic device) and to the opening in the accessory device. When the heat reaches the opening, ambient air may carry away the heat by convection, for example, and the heat may be removed from the accessory device. Also, the opening may be positioned in the accessory device in a location having a reduced likelihood of contact with a user, including the user's hand. This may prevent injury to the user caused by the heat that may accumulate at the opening.

The accessory may prevent overheating of the electronic device. Further, in some instances, an integrated circuit may be a "high performance" integrated circuit, such as a video processing circuit, monitored by a temperature sensor designed to alert a control circuit when the high performance integrated circuit reaches or surpasses a threshold temperature. The control circuit may then reduce electrical current to the high performance integrated circuit causing the temperature to reduce. This reduction in electrical current may reduce the overall performance and capabilities of the high performance integrated circuit. However, by navigating the heat away from the high performance integrated circuit, the accessory device may assist in maintaining a temperature of the high performance integrated circuit below the threshold temperature, and the performance of the high performance integrated circuit may not be compromised.

Still, other embodiments of an accessory device may include different features to transport heat. For example, the accessory device may include a first layer, or interior layer, formed from a porous material such as a microfiber fabric. The accessory device may further include a second layer, or middle layer, having one or more openings. Also, the accessory device may further include a third layer, or exterior layer, having miniature openings. For example, the third layer may include silicone material having multiple micro-perforations that allow air to extend through the micro-perforations. However, the micro-perforations may be sufficiently small to avoid ingress of contaminants such as water.

A thermally conductive feature, such as a phase change material ("PCM"), may be disposed between the first layer and the second layer. The PCM may include a waxed-based material having a relatively low melting temperature. For example, the PCM may include a melting temperature below a temperature generated by a battery or an integrated circuit (or integrated circuits) previously described. The PCM may be designed to extract or pull heat from the integrated circuit. In this regard, the PCM may be positioned proximate to the integrated circuit. When the integrated circuit generates heat during operation, the heat may pass to the PCM and the PCM changes from a solid state to a liquid state. The heat may then transfer from the PCM to an opening (or openings) of the second layer by means such as convection. Finally, the heat may dissipate through the micro-perforations. Accordingly, the accessory device may provide a heat transfer mechanism for the electronic device disposed in the accessory device.

In some instances, an electronic device may include its own means for navigating the heat away from a heat source in the electronic device. For example, a thermally conductive layer may be disposed or embedded in an enclosure of an electronic device. In this manner, the electronic device does not need an accessory device for purposes of heat navigation.

These and other embodiments are discussed below with reference to FIGS. 1-18. However, those skilled in the art will readily appreciate that the detailed description given herein with respect to these Figures is for explanatory purposes only and should not be construed as limiting.

FIG. 1 illustrates an isometric view of an embodiment of an electronic device 100, in accordance with the described embodiments. In some embodiments, the electronic device 100 is a tablet device. In the embodiment shown in FIG. 1, the electronic device 100 is a wireless communication device, such as a smartphone. The electronic device 100 may include an enclosure 102 designed to enclose several operational components, including integrated circuits, a speaker, a microphone, etc. In some embodiments, the enclosure 102 is formed from a metal, such as aluminum. The enclosure 102 may include a rear portion and several sidewalls extending from the rear portion. The electronic device 100 may further include a display 104 designed to display visual content. The display 104 may include a touch-sensitive layer (not shown) integrated with the display 104 such that the display 104 may receive and respond to a touch input by a user. Further, the touch-sensitive layer may include a capacitive touch sensitive layer that may receive and respond to a capacitive coupling with the capacitive touch sensitive layer. A protective layer 106 may overlay the display 104. The protective layer 106 may be formed from a transparent material, such as a glass material that covers the display 104. Also, the electronic device 100 may further include a button 108 designed to receive an additional input that may allow a user to provide a control to the electronic device 100 used to control, for example, an application or "app" visually presented on the display 104. The electronic device 100 may include an internal power source (such a battery) used to provide power in the form of electrical current to several internal components of the electronic device 100. Accordingly, the electronic device 100 may include a charging port 110 designed to receive power in order to provide power to the internal power supply and/or the internal components. Also, although not shown, the electronic device 100 may include one or more control inputs (such as button) disposed in various locations around the enclosure 102, with the control inputs offering different control features for the electronic device 100.

Figure 2:
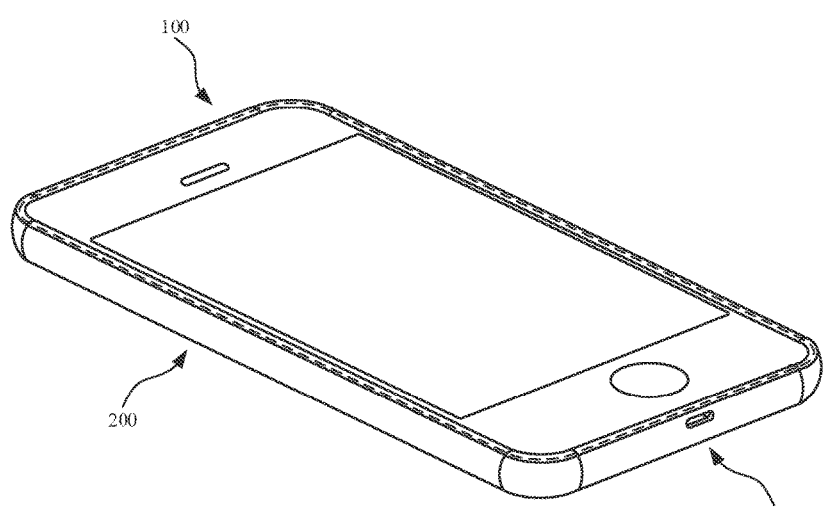
FIG. 2 illustrates an isometric view of the electronic device shown in FIG. 1, with the electronic device disposed in an accessory device.

The electronic device 100 may be used in conjunction with an accessory device designed to provide a protective cover that encloses the electronic device 100. An accessory device may reduce or prevent damage to the electronic device 100 caused by a load-bearing event, such as dropping the electronic device 100. For example, FIG. 2 illustrates an isometric view of the electronic device 100 shown in FIG. 1, with the electronic device 100 disposed in an accessory device 200, or case. As shown, the accessory device 200 is designed to cover a substantial portion of the electronic device 100, and in particular, the enclosure 102 (shown in FIG. 1). Also, the accessory device 200 may include an opening 202 in a location corresponding to a location of the charging port 110 (shown in FIG. 1). Also, when the electronic device 100 includes one or more control inputs disposed around the enclosure 102, the accessory device 200 may include a corresponding number of features, such as opening or protrusions, in locations corresponding to the control inputs. This allows the accessory device 200 to facilitate use of the control inputs. Also, as shown, the accessory device 200 may include several sidewalls extending from a rear portion (not shown) of the accessory device 200 to define a recessed region, or chamber, designed to receive the electronic device 100.

The accessory device 200 may be formed from one or more layers of material that combine to provide a protective cover for the electronic device. However, the accessory device 200 may include additional features designed to facilitate and enhance use of the electronic device 100. For example, the accessory device 200 may include one or more features designed to navigate heat away from the electronic device, and in particular, away from a heat-generating component (or operational component that generates heat during operation) in the electronic device 100.

Figure 3:
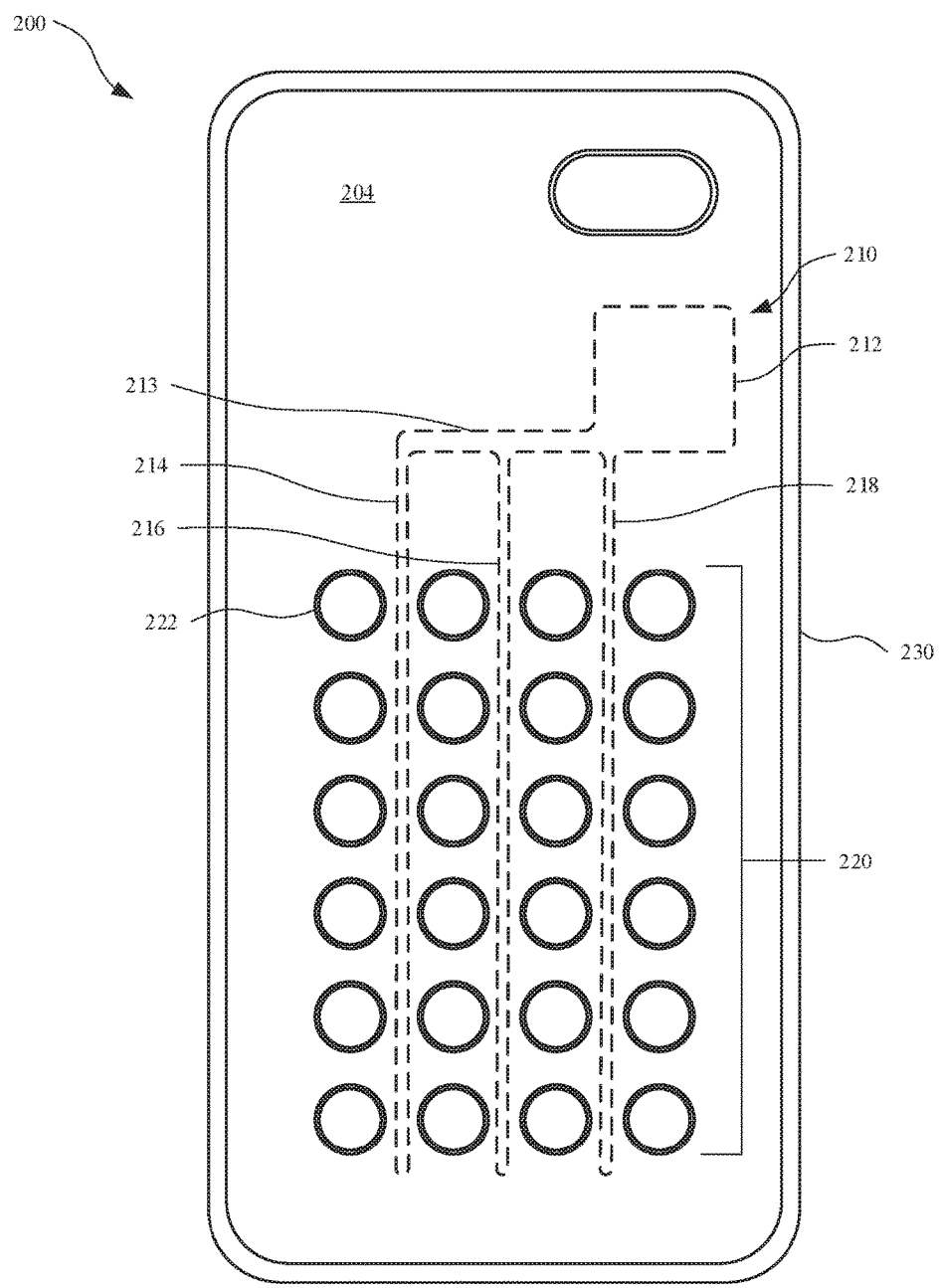
FIG. 3 illustrates a front view of the accessory device shown in FIG. 2, with the electronic device removed to show heat navigation features of the accessory device.

FIG. 3 illustrates a front view of the accessory device shown in FIG. 2, with the electronic device removed to show heat navigation features of the accessory device 200. As shown, the accessory device 200 may include a rear portion 204, or bottom wall, and a thermally conductive layer 210 disposed in the accessory device 200 and extending along the rear portion 204. The thermally conductive layer 210 may be referred to as a heat transfer mechanism designed to carry heat away from an electronic device, and in particular, a heat-generating component in the electronic device. In some embodiments, the thermally conductive layer 210 includes a metal wire (such as copper) capable of conducting heat. In other embodiments, the thermally conductive layer 210 includes a graphite material. In the embodiment shown in FIG. 3, the thermally conductive layer 210 includes a thermally conductive foam material capable of heat transmission. The foam material may include traces of material having a relatively high thermal conductivity in order to enhance the thermal conductivity of the foam material. However, in other embodiments, the thermally conductive layer 210 includes a thermal polymer. Also, as the thermally conductive layer 210 is shown in dotted lines, the thermally conductive layer 210 may be disposed between two or more layers of material and thus hidden from view. This will be discussed below.

The thermally conductive layer 210 may include several features designed to navigate heat (generated by an electronic device disposed in the accessory device 200) through the accessory device 200. For example, the thermally conductive layer 210 may include a platform feature 212 positioned in the rear portion 204. Generally, the platform feature 212 is positioned in a location corresponding to a location of a heat-generating component (or components) in an electronic device when the electronic device is disposed in the accessory device 200. For example, the platform feature 212 may be positioned in location proximate an integrated circuit(s), such as a global positioning system ("GPS") circuit and/or a video processor circuit. During use, the integrated circuit may generate heat causing the enclosure of the electronic device to increase its temperature. However, the location of the platform feature 212 may allow the thermally conductive layer 210 to absorb or collect the heat that may accumulate at the enclosure of the electronic device. Also, the platform feature 212 may include a size and a shape to encompass a region corresponding to several integrated circuits in the electronic device in order to absorb additional heat generated by the integrated circuits. While the platform feature 212 is shown in a particular location and having a particular size and shape, the location, size, and shape may vary in other embodiments.

In order to navigate the heat away from a heat-generating component in the electronic device, the thermally conductive layer 210 may include additional features. For example, as shown in FIG. 3, the thermally conductive layer 210 may further include several extension features, such as a first extension feature 214, a second extension feature 216, and a third extension feature 218, all which may be thermally coupled with the platform feature 212, and connected by a central portion 213. In other embodiments, however, the thermally conductive layer 210 may include more or less extension features. The first extension feature 214, the second extension feature 216, and the third extension feature 218 may combine to provide a thermally conductive path to transport heat received at the platform feature 212. Accordingly, the first extension feature 214, the second extension feature 216, and the third extension feature 218 may be used as heat pipes, or heat transfer mechanisms, each of which may provide a pre-defined heat path to navigate the heat absorbed by the platform feature 212 to another location along the rear portion 204 of the accessory device 200. Also, it should be apparent to one of ordinary skill in the art would realize that heat flows from a relatively warm body to a relatively cold body, and as such, the heat passes from the platform feature 212, when heated, to the relatively cooler extension features. Further, the first extension feature 214, the second extension feature 216, and the third extension feature 218 may be designed to retain any heat received from the platform feature 212 until the heat from the first extension feature 214, the second extension feature 216, and/or the third extension feature 218 transfer the heat to an additional feature of the accessory device 200.

In order to remove the heat from the accessory device 200, the accessory device 200 may further include openings 220 that allow the heat to transfer from the extension features to one or more of the openings 220. For example, as heat travels from the platform feature 212 to the first extension feature 214, the openings 220 may include a first opening 222 that may allow the heat from the first extension feature 214 to enter the first opening 222. Accordingly, the openings 220 may be thermally coupled with one or more extension features. As ambient air passes over the first opening 222 or a surface area defined by the first opening 222, the heat located near the first opening 222 may be carried away from the accessory device 200. The first opening 222 may therefore be referred to as a heat sink element designed to receive heat from the first extension feature 214. The description of the first opening 222 is intended as a representative opening, and it should be understood that any one or more of the openings 220 near an extension feature (or features) may allow heat from the extension feature (or features) to enter one or more of the openings 220. Also, while the openings 220 are shown as generally circular and having a similar size with one another, in other embodiments, the openings 220 include a polygonal shape and/or include variation in size and shape. Further, while the openings 220 are shown with each opening generally spaced apart the same distance as an adjacent opening, in other embodiments, the openings 220 may not only include various shapes and sizes, but one or more openings may also be spaced apart at different distances from their respective adjacent openings.

Also, although not shown, in some embodiments, one or more extensions features (similar to the first extension feature 214) may extend along one or more sidewalls of the accessory device 200. For example, in some embodiments, a first sidewall 230 of the accessory device 200 includes an extension feature designed to navigate heat away from a heat-generating component in an electronic device.

Figure 4:
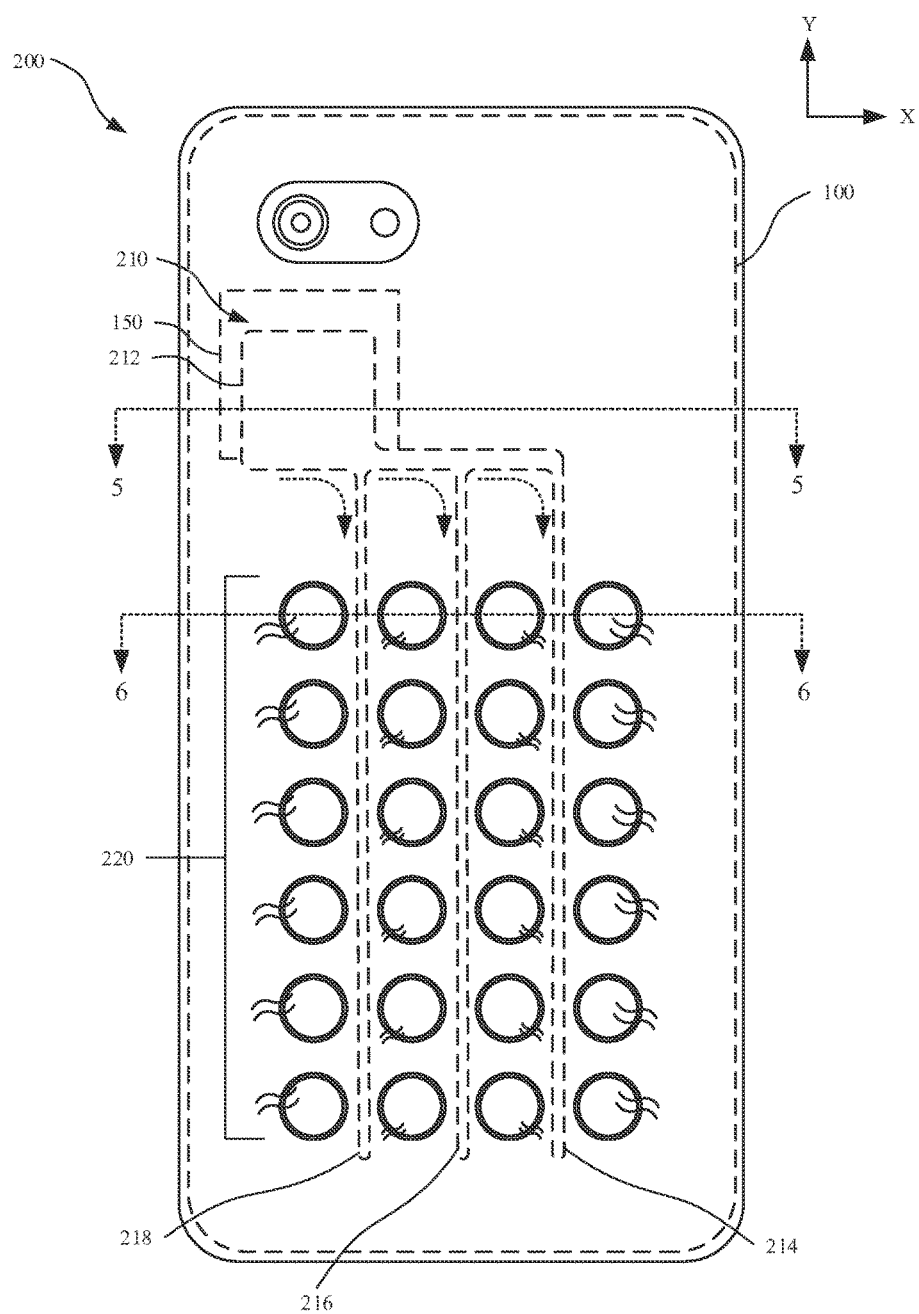
FIG. 4 illustrates a rear view of the accessory device with the electronic device disposed in the accessory device, further showing the accessory device removing heat from the electronic device.

FIG. 4 illustrates a rear view of the accessory device 200 with the electronic device 100 disposed in the accessory device 200, further showing the accessory device 200 removing heat from the electronic device 100. As shown, the electronic device 100 may include a circuit board 150 that includes one or more integrated circuits (not shown) that, during use of the electronic device 100, may generate heat. Further, when the enclosure of the electronic device 100 includes a metal or other relatively high thermally conductive material, the heat may extend into the enclosure. However, the thermally conductive layer 210 may be designed to remove the heat, particularly in specific locations. For example, the platform feature 212 may be positioned in a location of the accessory device 200 that corresponds to a location of the circuit board 150. Also, the platform feature 212 may generally include a size and a shape that spans a large portion of the circuit board 150 in order to absorb heat generated from the integrated circuits.

Figure 5:
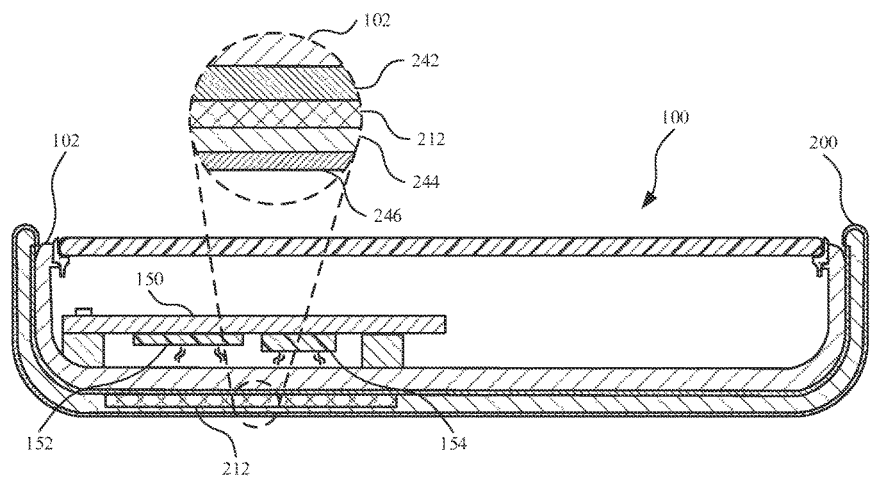
FIG. 5 illustrates a cross sectional view of the electronic device and the accessory device shown in FIG. 4, taken along line 5-5.

FIG. 5 illustrates a cross sectional view of the electronic device 100 and the accessory device shown in FIG. 4, taken along line 5-5. For purposes of simplicity and clarity, several features of the electronic device 100 are removed. As shown, the platform feature 212 may include a size that spans across a substantial portion of the circuit board 150 that includes, for example, a first integrated circuit 152 and a second integrated circuit 154. During operation of the electronic device 100, the first integrated circuit 152 and/or the second integrated circuit 154 may perform several operations causing heat generation that passes to the enclosure 102, as shown in FIG. 5. However, the location and material makeup of the platform feature 212 allows the platform feature 212 to extract and/or absorb the heat at the enclosure 102 allowing the thermally conductive layer 210 (shown in FIG. 4) to navigate the heat away from the circuit board 150.

Also, several layers may surround the platform feature 212. For example, as shown in the enlarged view, a first layer 242 and a second layer 244 of the accessory device 200 may surround the platform feature 212. The first layer 242 may be disposed between the enclosure 102 and the platform feature 212. In some embodiments, the first layer 242 includes a material that facilitates heat transfer from the enclosure 102 to the platform feature 212. In this regard, in some embodiments, the first layer 242 includes a heat conductive elastomer material. Accordingly, the first layer 242 may become hot during use of the electronic device 100. However, as the first layer 242 is generally not accessible to a user when the electronic device 100 is disposed in the accessory device 200, the user is not likely to be exposed to the first layer 242. Also, the platform feature 212 may be disposed or embedded in the second layer 244. In some embodiments, the second layer 244 is formed from a polymeric material. In the embodiment shown in FIG. 5, the second layer 244 is formed from a nylon material. The second layer 244 may provide the accessory device 200 with a structural or rigid feature while also insulating the user from the platform feature 212. Also, a third layer 246 may be generally disposed on an exterior region of the accessory device 200. In some embodiments, the third layer 246 is formed from silicone. The third layer 246 may be associated with aesthetic layer whole also providing additional thermal insulation for the user. Also, the second layer 244 and the third layer 246 may combine to form an insulation layer that prevents or limits heat transfer to an exterior region of the third layer 246. This may prevent or reduce the likelihood of heat exposure to a user of the accessory device 200.

Referring again to FIG. 4, due in part to the thermal conductivity of the thermally conductive layer 210, the heat generated by the integrated circuits during use of the electronic device 100 may readily pass from the platform feature 212 to the first extension feature 214, the second extension feature 216, and/or the third extension feature 218. The first extension feature 214, the second extension feature 216, and the third extension feature 218 may act as heat pipes transferring the heat to one or more of the openings 220. Also, the thermally conductive layer 210 may be designed such that the heat flows through the accessory device 200 is in the x- and y-directions. For example, heat in the platform feature 212 may pass to the extensions features in the x-direction, with the heat then continuing along the extension features in the y-direction. In this manner, by limiting at least some heat flow in the accessory device 200 in a direction away from the electronic device 100, the heat is less likely to pass to a user's hand and accordingly, any injury associated with the heat flowing through the accessory device 200 may be limited or prevented.

Figure 6:
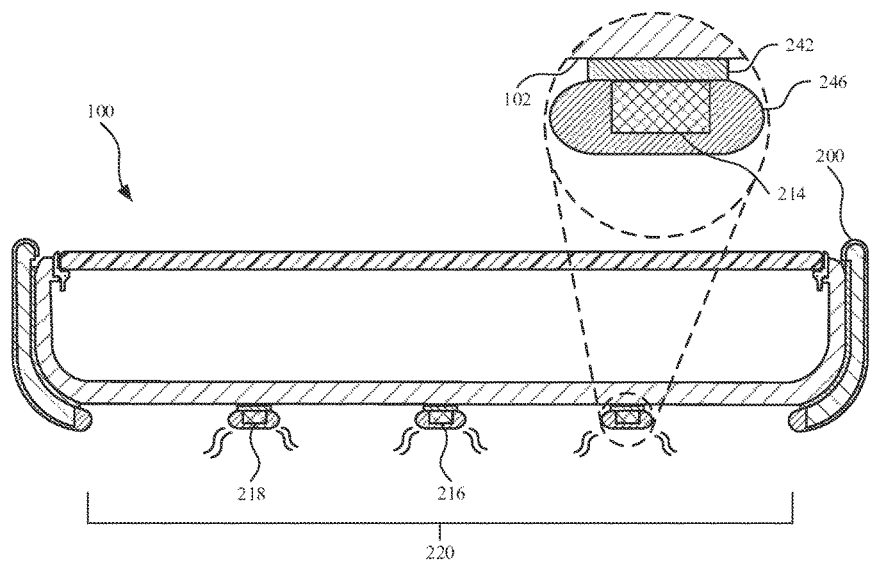
FIG. 6 illustrates a cross sectional view of the electronic device and the accessory device shown in FIG. 4, taken along line 6-6.

FIG. 6 illustrates a cross sectional view of the electronic device 100 and the accessory device 200 shown in FIG. 4, taken along line 6-6, showing heat dissipating from the extension features and to the openings 220. Again, for purposes of simplicity and clarity, several features of the electronic device 100 are removed. As shown, the heat may be transferred to the openings 220 by way of the first extension feature 214, the second extension feature 216, and/or the third extension feature 218. Also, shown, the first extension feature 214, the second extension feature 216, and the third extension feature 218 may be surrounded by one or more layers of material (previously described) designed to enhance heat transfer and/or thermal thermally insulate a user from direct contact with the extension features. For example, as shown in the enlarged view, the first layer 242 and the third layer 246 may surround the first extension feature 214. However, in other embodiments, the first layer 242, in the form of the heat conductive elastomer, surrounds the first extension feature 214 as well as the remaining extension features. This may provide additional heat transmission from the extension features to the openings 220.

Figure 7:
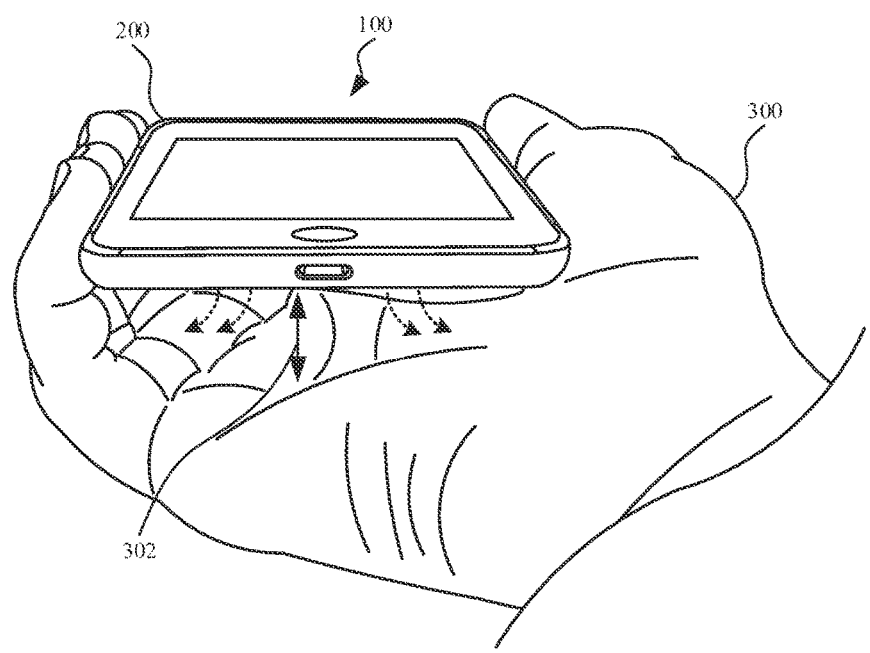
FIG. 7 illustrates an isometric view showing a user holding an electronic device disposed in an accessory device, in accordance with the described embodiments.

While the accessory device 200 is designed to navigate and remove heat from the electronic device 100, the heat leaving the openings 220 of the accessory device 200 may extend to a user of the accessory device 200. However, based on studies involving how user typically holds the accessory device 200 in their hand, the openings 220 may be positioned in a location in which a user is less likely to position a hand. For example, FIG. 7 illustrates an isometric view showing a hand 300 of a user holding the electronic device 100 disposed in the accessory device 200, in accordance with the described embodiments. The placement of the accessory device 200 in the hand 300 may be an exemplary holding configuration based on several studies. As shown, the accessory device 200 may be spaced from the hand 300, particularly in a palm region of the hand 300, by a distance 302. In this manner, any heat (shown as dotted lines) that leaves the accessory device 200 may be carried away by ambient air, for example, before contacting the hand 300. Accordingly, the accessory device 200 includes additional ergonomic features designed to enhance a user experience.

FIGS. 8-11 illustrate various embodiments of an accessory device designed to provide a protective cover as well as absorb heat from an electronic device in a similar manner as previously described. Further, thermally conductive layers shown and described in FIGS. 8-11 may include any feature (or features) and/or material composition previously described for a thermally conductive layer. Also, accessory devices shown and described in FIGS. 8-11 may include any layer or layers previously described for an accessory device.

Figure 8:
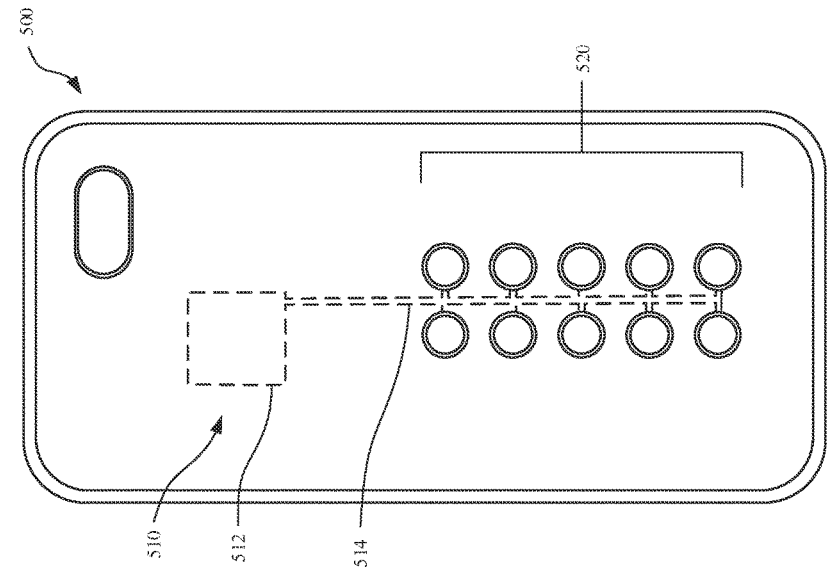
FIG. 8 illustrates a front view of an alternative embodiment of an accessory device having alternate heat navigation features, in accordance with the described embodiments.

FIG. 8 illustrates a front view of an alternative embodiment of an accessory device 400 having alternate heat navigation features, in accordance with the described embodiments. As shown, the accessory device 400 may include a thermally conductive layer 410 having a platform feature 412 and several extension features that extend between openings 420. However, the thermally conductive layer 410 may include additional extension features. For example, in additional to a first extension feature 414, a second extension feature, 416 and a third extension feature 418, the thermally conductive layer 410 may include an extension feature 432 that is thermally coupled with, and crossing, the first extension feature 414, the second extension feature, 416 and the third extension feature 418. The extension feature 432 may generally cross the first extension feature 414, the second extension feature, 416 and the third extension feature 418 in a perpendicular manner. The extension feature 432 allows an additional heat conduit for the thermally conductive layer 410 and also provides an additional pathway to several of the openings 420, such as a first row 422 of openings and a second row 424 of openings. The extension feature 432 may be a representative extension feature of the remaining extension features that cross the first extension feature 414, the second extension feature, 416 and the third extension feature 418.

Figure 9:
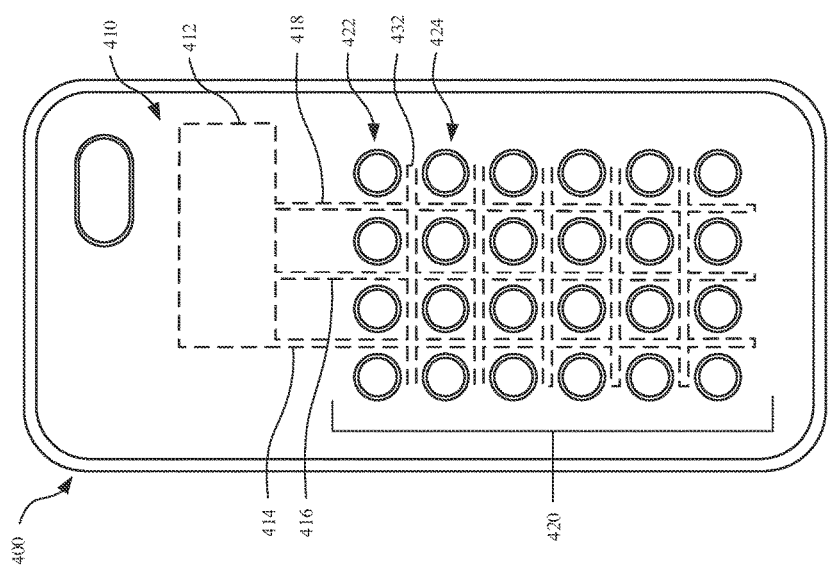
FIG. 9 illustrates a front view of an alternative embodiment of an accessory device having alternate heat navigation features, in accordance with the described embodiments.

FIG. 9 illustrates a front view of an alternative embodiment of an accessory device 500 having alternate heat navigation features, in accordance with the described embodiments. As shown, the accessory device 500 may include a thermally conductive layer 510 having a platform feature 512 located in a central region that may corresponding to a location one or more heat-generating components in an electronic device (not shown) when the electronic device is disposed in the accessory device 500. Also, the thermally conductive layer 510 may include an extension feature 514 that branches to openings 520 in the accessory device 500. This may allow for more efficient heat transfer from the extension feature 514 to the openings 520.

Figure 10:
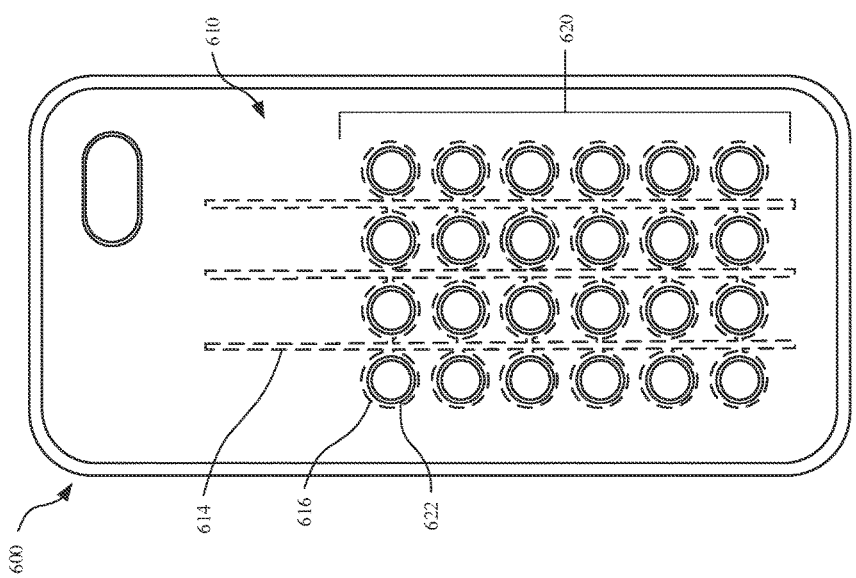
FIG. 10 illustrates a front view of an alternative embodiment of an accessory device having alternate heat navigation features, in accordance with the described embodiments.

FIG. 10 illustrates a front view of an alternative embodiment of an accessory device 600 having alternate heat navigation features, in accordance with the described embodiments. As shown, the thermally conductive layer 610 may include several extension features that extend or branch out to circumferentially surround the openings 620 in the accessory device 600. For example, a first extension feature 614 may include a first branching feature 616 having a shape similar to a first opening 622. However, as shown, the size of the first branching feature 616 is larger than that of the first opening 622, and accordingly, surrounds the first opening 622. This allows for additional heat transfer to the openings 620. Also, the thermally conductive layer 610 need not include a platform feature as the extension features may absorb heat from one or more heat-generating components in an electronic device (not shown) when the electronic device is disposed in the accessory device 600.

Figure 11:
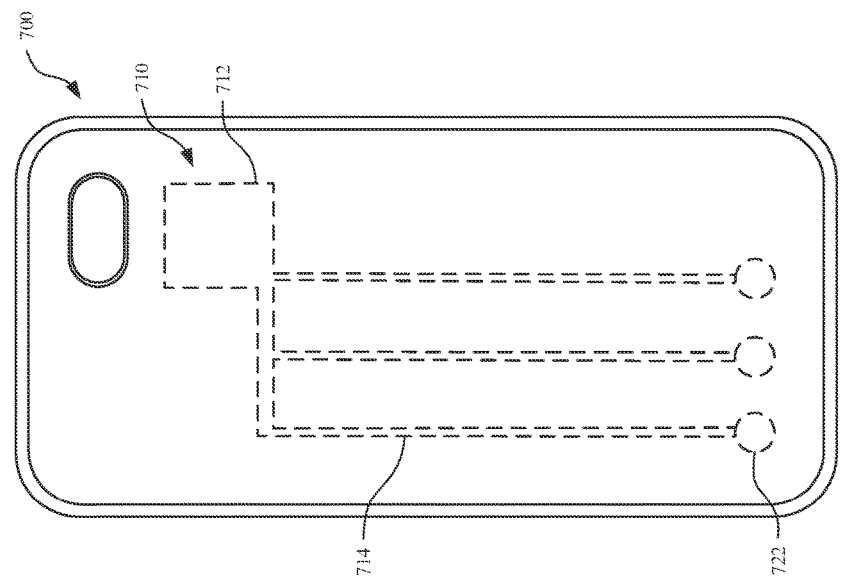
FIG. 11 illustrates a front view of an alternative embodiment of an accessory device having an alternate heat navigation features, in accordance with the described embodiments.

FIG. 11 illustrates a front view of an alternative embodiment of an accessory device 700 having alternate heat navigation features, in accordance with the described embodiments. As shown, the accessory device includes a thermally conductive layer 710 that includes a platform feature 712 and several extension features. However, in this embodiment, the accessory device 700 does not include openings. Rather, the extension features may navigate heat generated from a heat-generating component in an electronic device (not shown) to another location. For example, as shown in FIG. 11, a first extension feature 714 may be thermally coupled with a first thermally conductive feature 722 embedded in the accessory device 700. The first thermally conductive feature 722 may be designed to receive the heat and dissipate the heat by, for example, convection through one or more layers of the accessory device 700. However, similar to the first extension feature 714, the first thermally conductive feature 722 is hidden from view. In this manner, the accessory device 700 still acts as a heat-dissipating device while offering additional protection as the number of openings is reduced. Also, the first thermally conductive feature 722 may be positioned in a location that is less likely to be contacted by a user.

The various modifications and features shown in FIGS. 8-11 may be combined in other embodiments. For example, an accessory device may include a thermally conductive layer having no platform feature and no opening to convectively remove heat.

Figure 12:
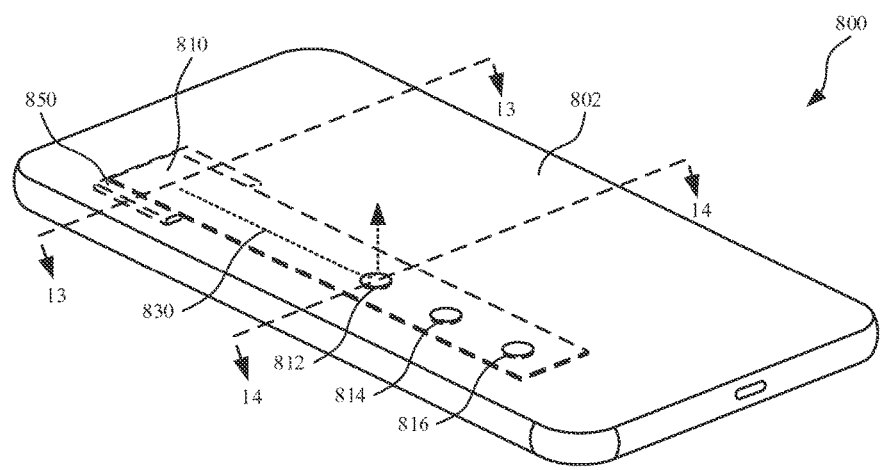
FIG. 12 illustrates a bottom isometric view of an embodiment of an electronic device having heat navigation features embedded in an enclosure of the electronic device.

In some instances, an electronic device may include certain heat navigation features and an accessory device may not be needed for purposes of heat transfer. For example, FIG. 12 illustrates a bottom isometric view of an embodiment of an electronic device 800 having heat navigation features embedded in an enclosure 802 of the electronic device 800. As shown, the electronic device 800 may include a thermally conductive layer 810 disposed in the electronic device 800. In some embodiments, the thermally conductive layer 810 includes a metal having a relatively high thermal conductivity, such as copper. In the embodiment shown in FIG. 12, the thermally conductive layer 810 includes graphite. Also, one end of the thermally conductive layer 810 may be positioned in a location proximate to a circuit board 850 having several integrated circuits (not shown) that may generate heat during use of the electronic device 800.

Figure 13:
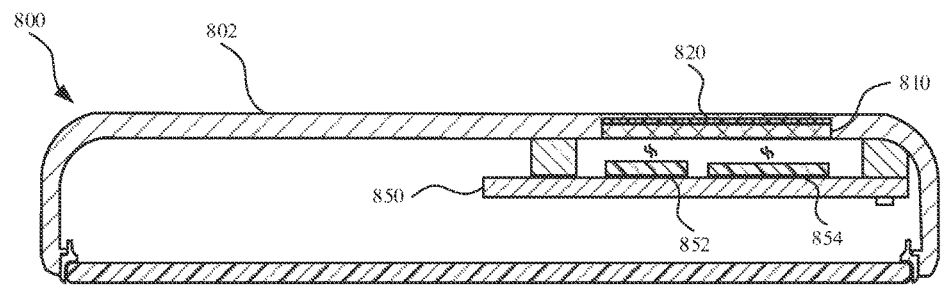
FIG. 13 illustrates a cross sectional view of the electronic device shown in FIG. 12, taken along line 13-13.

FIG. 13 illustrates a cross sectional view of the electronic device 800 shown in FIG. 12, taken along line 13-13. For purposes of simplicity, several components of the electronic device 800 are removed. As shown, the circuit board 850 in the electronic device 800 may include several heat-generating components, such as a first integrated circuit 852 and a second integrated circuit 854. In order to absorb heat generated by the heat-generating components, the thermally conductive layer 810 may be positioned proximate to the heat-generating components in order to absorb heat produced by the components. Further, in some embodiments, the enclosure 802 is designed to receive the thermally conductive layer 810. This may provide space for other components in the electronic device 800. Also, when the enclosure 802 is formed from a metal, such as aluminum, the heat absorbed by the thermally conductive layer 810 may be inclined to pass through the enclosure 802 to an exterior region of the enclosure 802. However, the electronic device 800 may further include a thermal insulation layer 820 formed from one or more materials having a relatively low thermal conductivity. The thermal insulation layer 820 may be disposed between the thermally conductive layer 810 and an exterior region of the enclosure 802, as shown in FIG. 13. In this manner, the thermal insulation layer 820 may prevent or reduce the likelihood of the enclosure 802 becoming hot during use of the electronic device 800 due in part to the heat-generating components previously described.

Referring again to FIG. 12, the dotted line 830 may represent an exemplary path taken by heat (generated from the heat-generating components) through the thermally conductive layer 810. In order to expel the heat from the electronic device 800, the thermally conductive layer 810 may include several protruding features, such as a first protruding feature 812, a second protruding feature 814, and a third protruding feature 816. In some embodiments, the first protruding feature 812, the second protruding feature 814, and/or the third protruding feature 816 extend from the thermally conductive layer 810 and are co-planar (or at least approximately co-planar) with respect to the exterior region of the enclosure 802. Accordingly, the enclosure 802 may include openings having a size and a shape corresponding to each of the protruding features of the thermally conductive layer 810. However, in other embodiments, the protruding features do not protrude completely through the enclosure 802, and as such, the enclosure 802 may not include through-hole openings for the protruding features.

Figure 14:
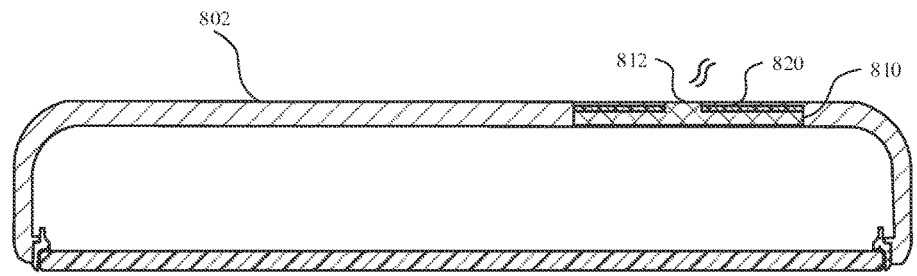
FIG. 14 illustrates a cross sectional view of the electronic device shown in FIG. 12, taken along line 14-14.

FIG. 14 illustrates a cross sectional view of the electronic device shown in FIG. 12, taken along line 14-14, showing the first protruding feature 812 extending through the enclosure 802. For purposes of simplicity, several components of the electronic device 800 are removed. The thermal insulation layer 820 may include openings having a size and a shape of the protruding features of the thermally conductive layer 810. For example, as shown in FIG. 14, the thermal insulation layer 820 includes an opening to accommodate the first protruding feature 812.

Several prior embodiments illustrate a thermally conductive layer including a solid and continuous material. However, in other embodiments, an accessory device may include discrete thermally conductive features. Further, in these embodiments, the accessory device may include other layers that combine with the discrete thermally conductive features to provide heat transfer from an electronic device.

Figure 15:
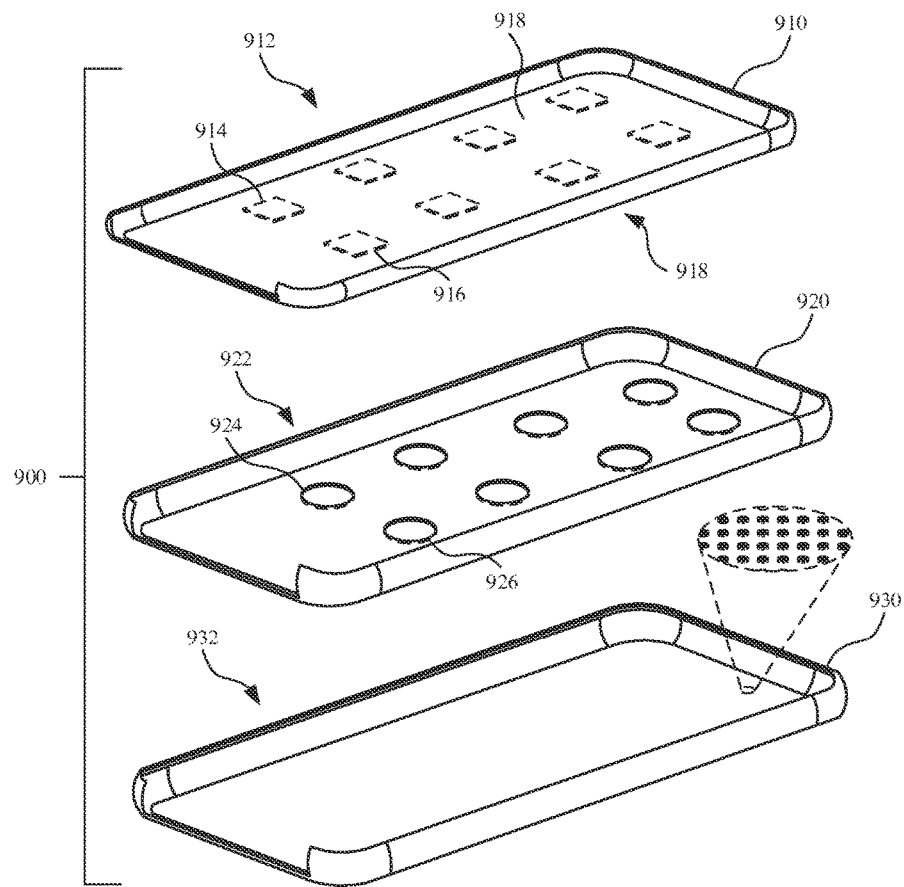
FIG. 15 illustrates an exploded view of an alternative embodiment of an accessory device, in accordance with the described embodiments.

For example, FIG. 15 illustrates an exploded view of an alternative embodiment of an accessory device 900, in accordance with the described embodiments. As shown, the accessory device 900 may include a first layer 910. In some embodiments, the first layer 910 is formed from a porous material, such as microfiber. When the first layer 910 includes a porous material, the accessory device 900 may be designed to allow heat generated from an electronic device (not shown) to pass through the first layer 910. Also, the first layer 910 may include one or more thermally conductive features 912 (shown as dotted lines), such as a first thermally conductive feature 914 and a second thermally conductive feature 916. The thermally conductive features 912 may be disposed on a rear exterior region 918 of the first layer 910. In some embodiments, the thermally conductive features 912 include a material (or materials) designed to absorb heat. Further, the thermally conductive features 912 may absorb heat by a phase change. For example, in response to heat generated by one or more heat-generating components in an electronic device, the thermally conductive features 912 may absorb or extract the heat, causing the thermally conductive features 912 to change from a solid state to a liquid (or quasi-liquid) state. Accordingly, the thermally conductive features 912 may include a melting temperature below a temperature associated with the heat generated by the heat-generating components. Although the thermally conductive features 912 include a rectangular shape as shown in FIG. 15, the thermally conductive features 912 may include various sizes and shapes. Also, the thermally conductive features 912 may be disposed along various locations of the rear exterior region 918 of the first layer 910.

The accessory device 900 may further include a second layer 920 designed to couple with the first layer 910. The second layer 920 may be formed from a polymeric material, such as plastic, designed to add structural rigidity to the accessory device 900. As shown, the second layer 920 may include openings 922, such as a first opening 924 and a second opening 926, extending through the second layer 920. The openings 922 may be designed to allow heat absorbed by the first layer 910, and in particular by the thermally conductive features 912, to pass through the second layer 920. The openings 922 may be positioned in a location corresponding to the thermally conductive features 912. Further, each of the openings 922 may include a size and a shape capable of receiving the thermally conductive features 912. For example, the first opening 924 may include a size and a shape capable of receiving the first thermally conductive feature 914. However, in other embodiments, the openings 922 are not designed to fully receive the thermally conductive features 912. In this regard, in some embodiments, a portion of one or more of the thermally conductive features 912 is not fully positioned in one of the openings 922. For example, in some embodiments, the first thermally conductive feature 914 is larger than the first opening 924. Regardless, at least a portion of the thermally conductive features 912 may align with at least one of the openings 922 allowing heat to transfer from the thermally conductive features 912 to one or more of the openings.

The accessory device 900 may further include a third layer 930 designed to couple with the second layer 920. In some embodiments, the third layer 930 includes a silicone material. In this regard, the third layer 930 may be designed to provide an aesthetic and low-maintenance cover that may easily cleaned and may readily resist microorganisms. Further, the third layer 930 may include openings 932 disposed throughout the third layer 930. In some embodiments, the openings 932 are micro-perforations generally not visible by a user of the accessory device 900. As shown in the enlarged view, the openings 932 may be relatively dense. This may allow heat transfer from the second layer 920, or from openings 922 in the second layer 920, to the openings 932 of the third layer 930. Although the openings 932 are shown in a rear portion of the third layer 930, the openings 932 may be disposed along any region of the third layer 930, including the sidewalls.

Although the embodiment shown in FIG. 15 includes the thermally conductive features 912 positioned between the first layer 910 and the second layer 920, the thermally conductive features 912 may, in addition or alternatively, be positioned between the second layer 920 and the third layer 930.

Figure 16:
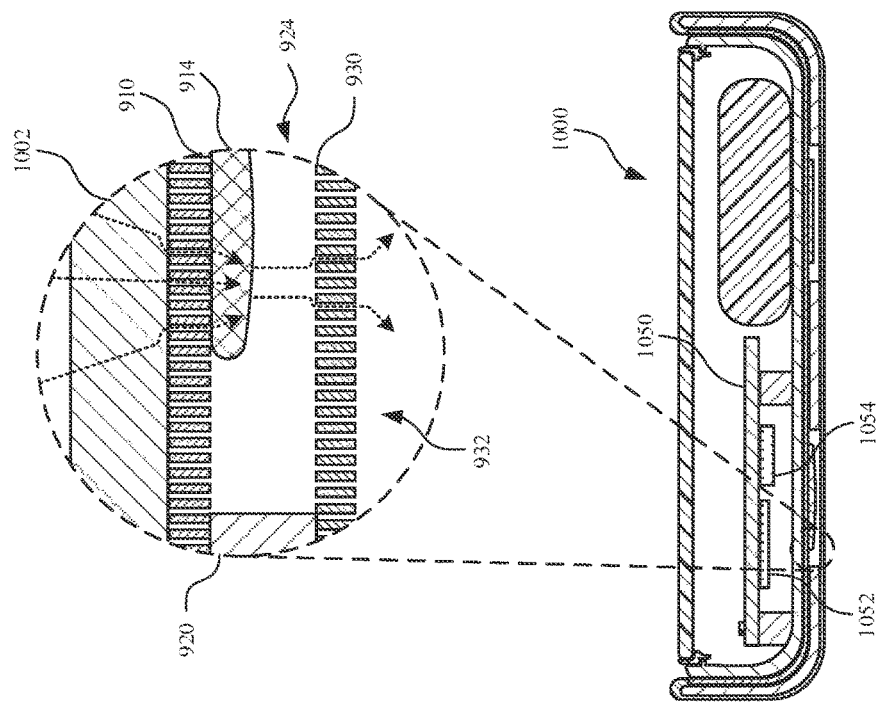
FIG. 16 illustrates a cross sectional view of the accessory device shown in FIG. 15, showing heat generated from an electronic device being removed by the accessory device.

FIG. 16 illustrates a cross sectional view of the accessory device 900 shown in FIG. 15, showing heat generated from an electronic device 1000 (disposed in the accessory device 900) being removed by the accessory device 900. For purposes of simplicity, several components of the electronic device 1000 are removed. As shown, the electronic device 1000 may include a circuit board 1050 having one or more heat-generating components, such as a first integrated circuit 1052 and a second integrated circuit 1054. As shown in the enlarged view, heat (shown as dotted lines) generated from the heat-generating components may extend to the enclosure 1002. However, the thermally conductive features 912 (shown in FIG. 15) may be positioned in a location corresponding to the heat-generating components. For example, the first thermally conductive feature 914 may be positioned proximate to the first integrated circuit 1052 and the second integrated circuit 1054. In this manner, the first thermally conductive feature 914 may be exposed to heat generated from the first integrated circuit 1052 and/or the second integrated circuit 1054. Further, in response to the heat exposure, the first thermally conductive feature 914 may absorb the heat by changing from a solid state to a liquid state. Then, the heat may pass from through first thermally conductive feature 914 to the third layer 930 via the first opening 924 in the second layer 920. Finally, the heat may pass through the third layer 930 via the openings 932 in the third layer 930. Accordingly, the accessory device 900 may be designed to extract heat from the electronic device 100 through the first layer 910 using the first thermally conductive feature 914, and then through the second layer 920 and the third layer 930 using the first opening 924 (of the second layer 920) and the openings 932 (of the third layer 930), respectively.

Figure 17:
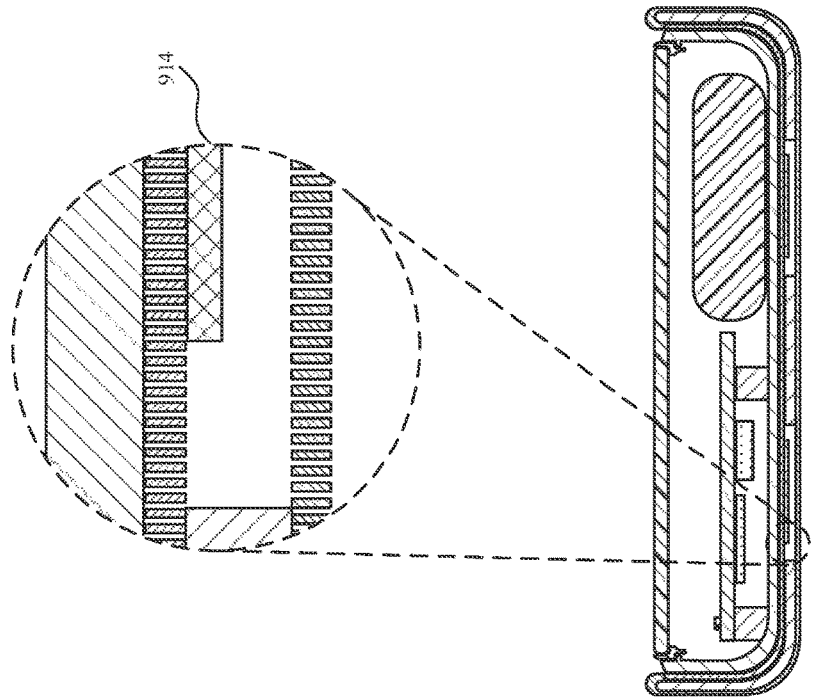
FIG. 17 illustrates a cross sectional view of the accessory device shown in FIG. 16, with the heat generated from an electronic device removed and the phase change material changing from a liquid state back to a solid state.

FIG. 17 illustrates a cross sectional view of the accessory device 900 shown in FIG. 16, with the heat generated from an electronic device 100 removed and the first thermally conductive feature 914 changing from a liquid state back to a solid state. With the heat removed, the first thermally conductive feature 914 may return to the solid state in a relatively rigid state and having a reduced size. The first thermally conductive feature 914, representative of the remaining thermally conductive features, may be re-used in subsequent heat-absorbing operations.

Figure 18:
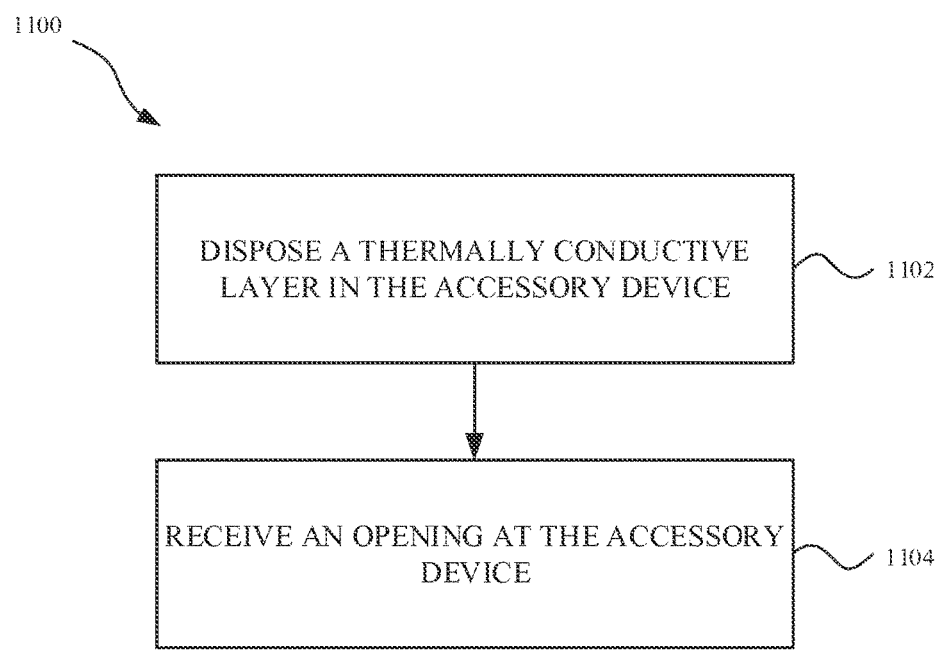
FIG. 18 illustrates a flowchart showing a method for removing heat from an electronic device using an accessory device.

FIG. 18 illustrates a flowchart 1100 showing a method for removing heat from an electronic device using an accessory device, in accordance with the described embodiments. In step 1102, a thermally conductive layer is disposed in the accessory device. The thermally conductive layer may include several features, such as a platform feature positioned in a location corresponding to one or more heat-generating components in the electronic device. This may allow the platform feature to absorb or extract heat from the one or more heat-generating components. The thermally conductive layer may further include one or more extension features thermally coupled with the platform feature and extending from the platform feature along a rear portion of the accessory device. The extension features may also extend between one or more openings in the accessory device, with the extension features designed to carry and navigate heat received, for example, at the platform feature and away from the one- or more heat generating components, and to the one or more openings. Also, the material or materials used to form the thermally conductive layer may include, as non-limiting examples, a metal, such as copper in a wire or mesh form, a thermally conductive foam, or graphite.

In step 1104, an opening is received at the accessory device. The openings may be the previously described one or more openings, and may be disposed between one or more extension features. The openings may receive heated air from the extension features and allow air to pass by the openings in order to carry away the heat from the accessory device.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An accessory device capable of removably coupling with an electronic device having a component, the accessory device comprising:
   a back wall and sidewalls extending from the back wall, the back wall and the sidewalls defining an internal volume capable of receiving the electronic device, the back wall comprising a first surface, a second surface, and a through hole that extends from the first surface to the second surface;
a thermally conductive layer that is disposed in the back wall such that the thermally conductive layer is covered by the first surface and the second surface, the thermally conductive layer comprising:
a platform that is capable of receiving heat that is generated by the component;
a central portion that is connected to the platform; and
an extension that extends from the central portion and laterally offset with respect to the platform, the extension defining a pre-defined heat path that limits a transfer of the heat through the back wall, wherein the extension is capable of passing at least some of the heat out of the back wall by way of the through hole.

2. The accessory device of claim 1, wherein the thermally conductive layer comprises a thermally conductive foam embedded in the back wall.

3. The accessory device of claim 1, further comprising:
a first layer that defines the first surface and covers a first region of the back wall and the sidewalls; and
a second layer that defines the second surface and covers a second region of the back wall and the sidewalls, wherein the thermally conductive layer is positioned between the first layer and the second layer.

4. The accessory device of claim 3, wherein the first layer comprises a thermally conductive elastomer.

5. The accessory device of claim 3, wherein the back wall and the sidewalls are formed from a plastic.

6. The accessory device of claim 1, wherein the extension is perpendicular to the central portion.

7. The accessory device of claim 1, further comprising a microfiber layer that covers the sidewalls and the back wall except for the through hole.

8. A method for forming an accessory device having a shell, wherein the shell includes a back wall having a through hole, the shell configured to secure an electronic device and aid in navigating heat away from a heat-generating component in the electronic device, the method comprising:
embedding a platform of a thermally conductive layer in the back wall in a first location that corresponds to a location of the heat-generating component when the electronic device is secured by the shell;
embedding a central portion of the thermally conductive layer that is connected to the platform; and
embedding an extension of the thermally conductive layer in a second location of the back wall that is different from the platform and the central portion, the platform, the central portion, and the extension formed from a thermally conductive foam, the extension connected to the central portion and laterally offset with respect to the platform and located closer to the through hole than the platform, the thermally conductive layer defining a path along which the heat flows from the first location to the second location, the path occupying a limited portion of the back wall, wherein the platform, the central portion, and the extension are concealed in the back wall, and wherein the heat at the extension is dissipated from the thermally conductive layer to the through hole.

9. The method of claim 8, further comprising:
disposing a thermally conductive elastomer over a first surface of the thermally conductive layer, the thermally conductive elastomer configured to extract the heat from the electronic device; and
disposing a nylon layer over a second surface of the thermally conductive layer, the second surface opposite the first surface.

10. The method of claim 8, wherein disposing the thermally conductive layer in the accessory device comprises:
disposing a platform feature in a location corresponding to the heat-generating component of the electronic device; and
forming an extension feature thermally coupled with the platform feature and the through hole.

11. The method of claim 10, further comprising covering the back wall with a microfiber layer, wherein the microfiber layer covers the back wall except for the through hole.

12. The method of claim 10, further comprising receiving a second extension feature that crosses the extension feature, wherein the extension feature and the second extension feature combine to navigate the heat along the accessory device to the through hole.

13. The method of claim 8, wherein the thermally conductive layer is capable of navigating the heat from the first location to the second location along the path.

14. The method of claim 8, further comprising positioning the extension perpendicular to the central portion.

15. An accessory device capable of removably coupling with an electronic device that includes a heat-generating component configured to generate heat, the accessory device comprising:
a shell defining an interior volume having a size and shape corresponding to that of the electronic device, the shell comprising a first through hole and a second through hole;
a first layer covering a first surface of the shell except for the first through hole and the second through hole, the first layer capable of engaging the electronic device when the electronic device is positioned in the interior volume;
a second layer covering a second surface of the shell except for the first through hole and the second through hole, the second layer different from the first layer; and
a thermally conductive foam embedded in the shell between, and covered by, the first layer and the second layer, the thermally conductive foam comprising i) a first portion positioned at a location corresponding to the heat-generating component, and ii) a second portion extending continuously from the first portion between the first through hole and the second through hole, the thermally conductive foam capable of transferring the heat received at the first portion to the second portion.

16. The accessory device of claim 15, further comprising a back wall defined in part by the shell, the first layer, and the second layer, wherein the thermally conductive foam is positioned in the back wall.

17. The accessory device of claim 16, wherein:
the first portion comprises a platform,
the second portion comprises an extension thermally coupled to the platform, and the platform and the extension are confined to a limited portion of the back wall.

18. The accessory device of claim 17, further comprising a through hole formed in the back wall, wherein the extension is thermally coupled to the through hole.

19. The accessory device of claim 15, wherein
the first portion comprises a platform that is capable of receiving heat that is generated by the component, and the second portion comprises i) a central portion that is connected to the platform, and ii) an extension that extends from the central portion and laterally offset with respect to the platform, the extension being perpendicular with respect to the central portion.

\* \* \* \* \*